(12) United States Patent
Miyoshi et al.

(10) Patent No.: US 9,621,997 B2
(45) Date of Patent: *Apr. 11, 2017

(54) ELECTROACOUSTIC TRANSDUCTION FILM

(71) Applicant: FUJIFILM Corporation, Tokyo (JP)

(72) Inventors: Tetsu Miyoshi, Ashigara-kami-gun (JP); Yusuke Hatanaka, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/862,380

(22) Filed: Sep. 23, 2015

(65) Prior Publication Data

US 2016/0014526 A1    Jan. 14, 2016

Related U.S. Application Data

(63) Continuation of application No. PCT/JP2014/058858, filed on Mar. 27, 2014.

(30) Foreign Application Priority Data

Apr. 1, 2013    (JP) .................................. 2013-075961

(51) Int. Cl.
    *H04R 17/00*     (2006.01)
    *H01L 41/37*     (2013.01)
    (Continued)

(52) U.S. Cl.
    CPC ........... *H04R 17/00* (2013.01); *H01L 41/183* (2013.01); *H01L 41/257* (2013.01); *H01L 41/37* (2013.01);
    (Continued)

(58) Field of Classification Search
CPC . H04R 2217/00–2217/03; H04R 17/02; H04R 2440/00–2440/07; H04R 7/00; H04R 2207/00
(Continued)

(56) References Cited

U.S. PATENT DOCUMENTS

| | | | |
|---|---|---|---|
| 2010/0061573 A1* | 3/2010 | Fujise | .................... H04R 17/00 381/190 |
| 2013/0256581 A1 | 10/2013 | Miyoshi et al. | |
| 2014/0003634 A1* | 1/2014 | Ito | ......................... C08L 101/10 381/190 |

FOREIGN PATENT DOCUMENTS

| | | |
|---|---|---|
| JP | 2000-338901 A | 12/2000 |
| JP | 2002-185053 A | 6/2002 |

(Continued)

OTHER PUBLICATIONS

International Preliminary Report on Patentability and English translation of the Written Opinion of the International Searching Authority (Forms PCT/IB/338, PCT/IB/373 and PCT/ISA/237), dated Oct. 15, 2015, for International Application No. PCT/JP2014/058858.

(Continued)

*Primary Examiner* — Suhan Ni
(74) *Attorney, Agent, or Firm* — Birch, Stewart, Kolasch & Birch, LLP

(57) ABSTRACT

Disclosed is an electroacoustic transduction film suitable for a flexible speaker or the like, in which predetermined acoustic properties are able to be stably exhibited regardless of a bending state. The electroacoustic transduction film includes a polymer composite piezoelectric body in which piezoelectric body particles are dispersed in a viscoelastic matrix formed of a polymer material having viscoelasticity at a normal temperature, and electrode layers interposing the polymer composite piezoelectric body therebetween, and an area fraction of the piezoelectric body particles in a contact surface with respect to the electrode layer is less than or equal to 50%, and thus the object is attained.

20 Claims, 4 Drawing Sheets

(51) Int. Cl.
*H01L 41/257* (2013.01)
*H01L 41/18* (2006.01)
*H04R 31/00* (2006.01)
*H04R 7/04* (2006.01)

(52) U.S. Cl.
CPC ......... *H04R 17/005* (2013.01); *H04R 31/003* (2013.01); *H04R 7/04* (2013.01); *H04R 2499/11* (2013.01)

(58) Field of Classification Search
USPC .................................. 381/190, 173, 152, 426
See application file for complete search history.

(56) References Cited

FOREIGN PATENT DOCUMENTS

| JP | 2008-294493 A | 12/2008 |
|---|---|---|
| JP | 2009-103484 A | 5/2009 |
| JP | 2010-63249 A | 3/2010 |
| JP | 2012-142546 A | 7/2012 |

OTHER PUBLICATIONS

International Search Report, issued in PCT/JP2014/058858, dated Apr. 28, 2014.
Shirai et al. "A Microphone for telephone using composite piezoelectric polymer", The Institute of Electronics, Information and Communication Engineers Technical Report, Information Theory, 24, 15(1980).
Toyoki Kitayama, "366 Piezoelectric characteristics of polymer-ceramic composite", 1971, Proceedings of the Institute of Electronics, Information and Communication Engineers General Conference, 366 (1971).
Japanese Office Action, issued Aug. 23, 2016, for Japanese Application No. 2014-059040, along with an English machine translation.
Korean Office Action, issued Aug. 31, 2016, for Korean Application No. 10-2015-7026898, along with a partial English translation.

* cited by examiner

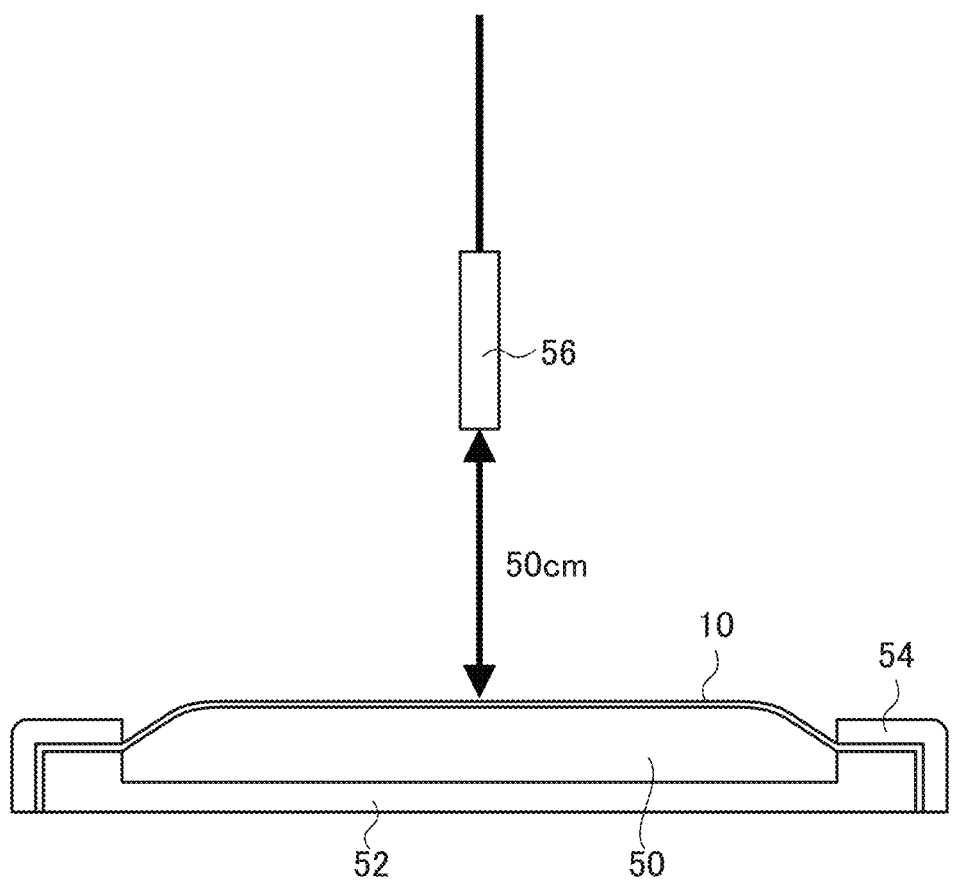

ELECTROACOUSTIC TRANSDUCTION FILM

CROSS-REFERENCE TO RELATED APPLICATIONS

This application is a continuation of PCT International Application No. PCT/JP2014/058858 filed on Mar. 27, 2014, which claims priority under 35 U.S.C. §119(a) to Japanese Patent Application No. 2013-075961 filed on Apr. 1, 2013. Each of the above applications is hereby expressly incorporated by reference, in its entirety, into the present application.

BACKGROUND OF THE INVENTION

The present invention relates to an electroacoustic transduction film used for an acoustic device such as a speaker or a microphone.

Recently, a flexible display using a flexible substrate of plastic or the like has been studied.

As a substrate of such a flexible display, for example, a flexible display substrate in which a gas barrier layer and a transparent conductive layer are laminated on a transparent plastic film is disclosed in JP2000-338901A.

The flexible display has superiority in lightweight properties, thinness, flexibility, and the like compared to a display of the related art using a glass substrate, and thus is able to be provided on a curved surface of a cylinder or the like. In addition, the flexible display is able to be contained by being rolled up, and thus even when a large-sized screen is used, portability is not impaired, and the flexible display has been attracting attention as a display for displaying advertisement, or a display device such as personal digital assistance (PDA).

When such a flexible display is used as a sound generating device with an image display device which concurrently reproduces an image and a sound as with a television receiver or the like, a speaker which is an acoustic device for generating a sound is necessary.

Here, as the shape of a speaker of the related art, a so-called cone shape such as a funnel-like shape, a spherical dome-like shape, and the like are generally used. However, when such a speaker is embedded in the flexible display described above, lightweight properties and flexibility which are the advantages of the flexible display may be impaired. In addition, when the speaker is attached to the outside of the flexible display, it is difficult to carry the flexible display and to dispose the flexible display on a curved wall, and thus the aesthetic properties of the flexible display may also be impaired.

Among them, as a speaker which is able to be integrated with the flexible display without impairing the lightweight properties or the flexibility, a speaker which is able to adopt a sheet-like piezoelectric film having flexibility is disclosed, for example, in JP2008-294493A.

The piezoelectric film is obtained by performing polarization processing with respect to a monoaxially stretched film of polyvinylidene fluoride (PVDF) at a high voltage, and thus has stretching and contracting properties according to the applied voltage.

In order to adopt the piezoelectric film as the speaker, it is necessary that a stretching and contracting movement is converted into a bending movement of a film surface according to a film surface. This conversion from the stretching and contracting, movement into the bending movement is attained by holding the piezoelectric film in a bent state, and thus the piezoelectric film is able to function as a speaker.

However, it is known that the lowest resonance frequency $f_0$ of a vibration plate for a speaker is denoted by the following expression. Here, s represents the rigidity of a vibration system, and m represents a mass.

Lowest Resonance Frequency:

$$f_0 = \frac{1}{2\pi}\sqrt{\frac{s}{m}}$$

At this time, the mechanical rigidity s decreases as the bending degree of the piezoelectric film, that is, the curvature radius of a bending portion becomes larger, and thus the lowest resonance frequency $f_0$ decreases. That is, the acoustic quality of the speaker (a sound volume, and frequency properties) is changed according to the curvature radius of the piezoelectric film.

In order to solve this problem, in JP2008-294493A, a sensor measuring the bending degree of the piezoelectric film is included, and an amplitude is corrected by increasing and decreasing the amplitude for each frequency band of a sound signal by a predetermined amount according to the bending degree of the piezoelectric film, and thus a stable sound is able to be output.

However, when the speaker formed of the piezoelectric film is integrated, the flexible display having a rectangular shape in a plan view is held in a state of being loosely bent like a newspaper or a magazine as a portable display, and the screen display is used by being vertically and horizontally switched, it is preferable that an image display surface is able to be bent not only in a vertical direction but also in a horizontal direction.

However, the monoaxially stretched piezoelectric film formed of PVDF has in-plane anisotropy in the piezoelectric properties thereof, and thus the acoustic quality is considerably changed according to a bending direction even at the same curvature.

Further, PVDF has a smaller loss tangent than a general vibration plate for a speaker such as cone paper, and thus a strong resonance is easily generated, and strong undulation is included in frequency properties. Accordingly, the changed amount of the acoustic quality at the time that the lowest resonance frequency $f_0$ is changed according to a change in the curvature increases.

Thus, in an acoustic quality correction means disclosed in JP2008-294493A, it is difficult to reproduce a stable sound due to the PVDF-specific problem.

On the other hand, as a sheet-like piezoelectric material which has no in-plane anisotropy in the piezoelectric properties and has flexibility, a polymer composite piezoelectric body is included in which piezoelectric ceramics is dispersed in a polymer matrix.

In a case of the polymer composite piezoelectric body, the piezoelectric ceramics is rigid but the polymer matrix is flexible, and thus energy may be absorbed before the vibration of the piezoelectric ceramics is entirely transmitted. This is the transmission efficiency of the dynamic vibration energy, and it is necessary to harden the polymer composite piezoelectric body in order to improve the transmission efficiency, and thus it is necessary that at least 40% to 50% of the piezoelectric ceramics is put into the matrix in a volume fraction.

For example, In Toyoki KITAYAMA, 1971, Proceedings of the Institute of Electronics, Information and Communication Engineers General Conference, 366 (1971), it is disclosed that a polymer composite piezoelectric body in which a powder of PZT ceramics which is a piezoelectric body is mixed with PVDF by using solvent casting or hot kneading makes the flexibility of PVDF and high piezoelectric properties of the PZT ceramics compatible to a certain degree.

However, when the ratio of the PZT ceramics increases in order to increase the piezoelectric properties, that is, the transmission efficiency, a mechanical defect that the polymer composite piezoelectric body becomes hard and brittle is generated.

In order to solve this problem, for example, in Seiichi SHIRAI, Hiroaki NOMURA, Toshio OGA, Takeshi YAMADA, and Nobuki OGUCHI, The Institute of Electronics, Information and Communication Engineers Technical Report, Information Theory, 24, 15(1980), it is disclosed that fluorine-containing rubber is added to PVDF, and thus flexibility is maintained.

SUMMARY OF THE INVENTION

It is possible to prepare an electroacoustic transduction film which is suitable for a speaker for a flexible display and has excellent flexibility by using such a polymer composite piezoelectric body, and by interposing the polymer composite piezoelectric body between electrodes.

Here, in order to adopt the electroacoustic transduction film using the polymer composite piezoelectric body as a speaker, it is necessary that the stretching and contracting movement of the piezoelectric ceramics is converted into the bending movement of the film surface.

As with the piezoelectric film described above, the conversion from the stretching and contracting movement of the piezoelectric ceramics to the bending movement of the film surface is also attained by holding the electroacoustic transduction film in a state of being bent to a certain degree. That is, the electroacoustic transduction film is held in a bent state, and thus it is possible to allow the electroacoustic transduction film to function as a speaker.

However, according to the consideration of the present inventors, it is necessary that the electroacoustic transduction film using the polymer composite piezoelectric body is bent in order to output a sound, and the properties of the electroacoustic transduction film decreases according to a bending state. In addition, when the electroacoustic transduction film is used as a flexible speaker, output properties may vary according to the bending state due to the usage conditions.

An object of the present invention is to solve such a problem of the related art, and is to provide an electroacoustic transduction film using a polymer composite piezoelectric body in which piezoelectric body particles are dispersed in a matrix formed of a polymer material, which is able to stably exhibit desired output properties regardless of the bending state due to the usage conditions or the like.

In order to attain the object, according to the present invention, there is provided an electroacoustic transduction film including a polymer composite piezoelectric body in which piezoelectric body particles are dispersed in a viscoelastic matrix formed of a polymer material having viscoelasticity at a normal temperature; and electrode layers disposed to interpose the polymer composite piezoelectric body therebetween, in which an area fraction of the piezoelectric body particles in a contact surface with respect to the electrode layer is less than or equal to 50%.

In such a electroacoustic transduction film of the present invention, it is preferable that in a surface of the polymer composite piezoelectric body facing the electrode layer, at least one of an arithmetic average roughness Ra of less than or equal to 1 μm, a maximum valley depth Rv of less than or equal to 6 μm, and a maximum height roughness Rz of less than or equal to 12 μm is satisfied.

In addition, it is preferable that an adhesive layer is included between the polymer composite piezoelectric body and at least one electrode layer.

In addition, it is preferable that the polymer composite piezoelectric body is subjected to calender processing.

In addition, it is preferable that the polymer composite piezoelectric body is subjected to polarization processing after the calender processing.

In addition, it is preferable that the area fraction of the piezoelectric body particles in the contact surface with respect to the electrode layer is lower than a volume fraction of the piezoelectric body particles which is calculated from a sectional machining surface of the polymer composite piezoelectric body by using a focused ion beam.

In addition, it is preferable that the volume fraction of the piezoelectric body particles which is calculated from the from the sectional machining surface of the polymer composite piezoelectric body by using the focused ion beam is greater than or equal to 50%.

In addition, it is preferable that a protective layer is included on a surface of at least one of the electrode layers.

In addition, it is preferable that the polymer material is a polymer material having high viscoelasticity at a normal temperature.

In addition, it is preferable that a thickness of the adhesive layer is less than or equal to 3 μm.

Further, it is preferable that the adhesive layer is formed of the same material as the polymer material.

The electroacoustic transduction film of the present invention has a low area fraction of the piezoelectric body particles in the contact surface with respect to the electrode layer. That is, the electroacoustic transduction film of the present invention has a small area in which the piezoelectric body particles are in direct contact with the electrodes.

Accordingly, in the electroacoustic transduction film of the present invention, the electrodes and the polymer composite piezoelectric body adhere to each other by a high adhesive force, and thus it is possible to prevent the electrode from being separated from the polymer composite piezoelectric body regardless of a bending state. For this reason, in the electroacoustic transduction film of the present invention, it is possible to prevent a decrease in properties due to the separation of the polymer composite piezoelectric body from the electrode regardless of the bending state, and thus it is possible to stably exhibit desired output properties.

BRIEF DESCRIPTION OF THE DRAWINGS

FIG. 4 is a conceptual diagram for illustrating a measuring method of a sound pressure level in an example of the present invention.

DETAILED DESCRIPTION OF THE INVENTION

Hereinafter, an electroacoustic transduction film of the present invention will be described in detail with reference to preferred examples illustrated in the accompanying drawings.

Figure 1A:
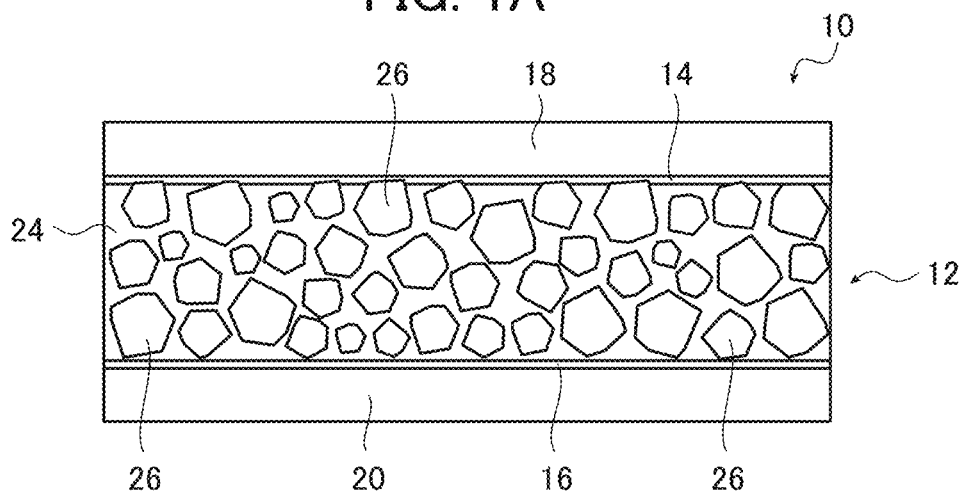
FIGS. 1A and 1B are diagrams conceptually illustrating an example of an electroacoustic transduction film of the present invention.

In FIG. 1A, an example of the electroacoustic transduction film of the present invention is conceptually illustrated.

An electroacoustic transduction film 10 illustrated in FIG. 1A (hereinafter, referred to as a transduction film 10) basically includes a piezoelectric layer 12 formed of a polymer composite piezoelectric body, a thin film electrode 14 disposed on one surface of the piezoelectric layer 12 and a thin film electrode 16 disposed on the other surface of the piezoelectric layer 12, and a protective layer 18 disposed on the surface of the thin film electrode 14 and a protective layer 20 disposed on the surface of the thin film electrode 16.

Such a transduction film 10 is used for generating (reproducing) a sound due to a vibration according to an electrical signal or for converting the vibration due to the sound into the electrical signal in various acoustic devices (an acoustic device) such as a pickup used in a speaker, a microphone, and musical instruments such as a guitar.

In the transduction film 10 of the present invention, the piezoelectric layer 12 is formed of the polymer composite piezoelectric body.

That is, the piezoelectric layer 12 has a configuration in which piezoelectric body particles 26 are dispersed in a matrix 24 formed of a polymer material.

In the transduction film 10 of the present invention, the (viscoelastic) matrix 24 formed of the polymer material having viscoelasticity at a normal temperature is used in the piezoelectric layer 12. Furthermore, herein, the "normal temperature" indicates a temperature range of approximately 0° C. to 50° C.

Here, it is preferable that the piezoelectric layer 12 used in a speaker having flexibility has the following requisites.

(i) Flexibility

For example, when a display including a flexible speaker configured of the piezoelectric layer 12 is held in a state of being loosely bent like a newspaper or a magazine as a portable device, the piezoelectric layer 12 is continuously subjected to large bending deformation from the outside at a comparatively slow vibration of less than or equal to a few Hz. At this time, when the polymer composite piezoelectric body is hard, large bending stress is generated to that extent, and a crack is generated on a boundary surface between the polymer matrix and the piezoelectric body particles, and thus the piezoelectric layer may be broken. Accordingly, the polymer composite piezoelectric body is required to have suitable flexibility. In addition, when strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy, and thus a sound is reproduced. Accordingly, in order to increase the transmission efficiency of the vibration energy, the polymer composite piezoelectric body is required to have suitable hardness. In addition, when the frequency properties of the speaker become smooth, the changed amount of the acoustic quality at the time that the lowest resonance frequency $f_0$ is changed according to a change in the curvature also decreases. Accordingly, the loss tangent of the polymer composite piezoelectric body is required to be suitably large.

As described above, the piezoelectric layer 12 used in a speaker having flexibility is required to be rigid with respect to a vibration of 20 Hz to 20 kHz, and to be flexible with respect to a vibration of less than or equal to a few Hz. In addition, the loss tangent of the piezoelectric layer 12 is required to be suitably large with respect to the vibration of all frequencies of less than or equal to 20 kHz.

In general, a polymer solid has a viscoelasticity relieving mechanism, a molecular movement having a large scale is observed as a decrease (relief) in a storage elastic modulus (Young's modulus) or the maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the piezoelectric layer 12, the polymer material of which the glass transition point is normal temperature, in other words, the polymer material having viscoelasticity at a normal temperature is used in the matrix 24, and thus the piezoelectric layer 12 which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is normal temperature is used in the matrix 24 of the piezoelectric layer 12.

As the polymer material having viscoelasticity at a normal temperature, various known materials are able to be used. Preferably, a polymer material of which the maximum value of a loss tangent Tan δ at a frequency of 1 Hz at a normal temperature in a dynamic viscoelasticity test is greater than or equal to 0.5 is used.

Accordingly, when the piezoelectric layer 12 is slowly bent due to an external force, stress concentration on the boundary surface between the matrix 24 and the piezoelectric body particles 26 at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time that the piezoelectric layer 12 is slowly bent due to the external force, and it is possible to make the piezoelectric layer 12 rigid with respect to an acoustic vibration of 20 Hz to 20 kHz.

In addition, it is more preferable that the relative permittivity of the polymer material is greater than or equal to 10 at 25° C. Accordingly, when a voltage is applied to the polymer composite piezoelectric body, a higher electric field is applied to the piezoelectric body particles 26 in the matrix 24, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride coacrylonitrile, a polystyrene-vinyl polyisoprene block copolymer, polyvinyl methyl ketone, polybutyl methacrylate, and the like are exemplified. In addition, as these polymer materials, a commercialized product such as Hybrar 5127 (manufactured by Kuraray Co., Ltd.) is also able to be preferably used.

Furthermore, only one of these polymer materials may be used, or a plurality types thereof may be used in combination (mixture).

The matrix 24 using such a polymer material having viscoelasticity at a normal temperature, as necessary, may use a plurality of polymer materials in combination.

That is, in order to adjust dielectric properties or mechanical properties, other dielectric polymer materials may be added to the matrix 24 in addition to a viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, vinylidene cyanide-vinyl acetate copolymer, a polymer having a cyano group or a cyanoethyl group such as cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, synthetic rubber such as nitrite rubber or chloroprene rubber, and the like are exemplified.

Among them, a polymer material having a cyanoethyl group is preferably used.

Furthermore, in the matrix 24 of the piezoelectric layer 12, the dielectric polymer added to a material having viscoelasticity at a normal temperature such as cyanoethylated PVA is not limited to one dielectric polymer, and a plurality of dielectric polymers may be added.

In addition, in order to adjust the glass transition point (Tg), a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Further, in order to improve adhesiveness, a tackifier such as rosin ester, rosin, terpene, terpene phenol, and a petroleum resin may be added.

In the matrix 24 of the piezoelectric layer 12, the added amount at the time of adding a polymer in addition to the viscoelastic material such as cyanoethylated PVA is not particularly limited, and it is preferable that a ratio of the added polymer to the matrix 24 is less than or equal to 30 mass %.

Accordingly, it is possible to exhibit the properties of the polymer material to be added without impairing the viscoelasticity relieving mechanism of the matrix 24, and thus a preferred result is able to be obtained from a viewpoint of increasing a dielectric constant, of improving heat resistance, and of improving adhesiveness between the piezoelectric body particles 26 and the electrode layer.

Furthermore, in the transduction film 10 of the present invention, as the matrix 24 of the piezoelectric layer 12 (the polymer composite piezoelectric body), various polymer materials which are used in a known polymer composite piezoelectric body are able to be used in addition to such a matrix having viscoelasticity at a normal temperature.

Specifically, polyvinylidene fluoride (PVDF), cyanoethylated pullulan, nylon, and the like are exemplified.

In the transduction film 10 of the present invention, as the piezoelectric body particles 26 of the piezoelectric layer 12, various particles formed of a known piezoelectric material are able to be used. It is preferable that the piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are preferably exemplified.

In the present invention, piezoelectric the particle diameter of the body particles 26 is not particularly limited. However, according to the consideration of the present inventors, it is preferable that the particle diameter of the piezoelectric body particles 26 is 1 $\mu$m to 20 $\mu$m.

By setting the particle diameter of the piezoelectric body particles 26 to be in the range described above, a preferred result is able to be obtained from a viewpoint of making high piezoelectric properties and flexibility compatible. Further, by setting the particle diameter of the piezoelectric body particles 26 to be in the range described above, it is possible to more stably increase the surface smoothness of the piezoelectric layer 12 regardless of the film thickness of the piezoelectric layer 12 or the like.

In the piezoelectric layer 12, a quantitative ratio of the matrix 24 and the piezoelectric body particles 26 may be suitably set according to the size (the size in a surface direction) or the thickness of the piezoelectric layer 12, the usage of the piezoelectric layer 12, properties required for the piezoelectric layer 12, and the like.

Here, according to the consideration of the present inventors, it is preferable that the volume fraction of the piezoelectric body particles 26 in the piezoelectric layer 12 is 30% to 70%, and in particular, it is preferable that the volume fraction is greater than or equal to 50%, and thus it is more preferable that the volume fraction is 50% to 70%.

By setting the quantitative ratio of the matrix 24 and the piezoelectric body particles 26 to be in the range described above, the energy transmission in the stretching and contracting of the piezoelectric body particles 26 is efficiently performed, and thus it is possible to obtain a preferred result from a viewpoint of making high piezoelectric properties and flexibility compatible.

Furthermore, in the present invention, the volume fraction of the piezoelectric body particles 26 in the piezoelectric layer 12 may be calculated by using, for example, image analysis software (as an example, Image J which is public software) on the basis of image data obtained by observing a sectional machining surface of the piezoelectric layer 12 (the polymer composite piezoelectric body) due to a focused ion beam (FIB) using a scanning type electron microscope (FE-SEM, for example, S-4100 manufactured by Hitachi, Ltd.).

In addition, in the transduction film 10 of the present invention, the thickness of the piezoelectric layer 12 is not also particularly limited, and may be suitably set according to the size of the transduction film 10, the usage of the transduction film 10, properties required for the transduction film 10, and the like.

Here, according to the consideration of the present inventors, it is preferable that the thickness of the piezoelectric layer 12 is 10 μm to 200 μm, and in particular, it is preferable that the thickness is 15 μm to 100 μm.

By setting the thickness of the piezoelectric layer 12 to be in the range described above, it is possible to obtain a preferred result from a viewpoint of making ensuring rigidity and suitable flexibility compatible.

Furthermore, as described above, it is preferable that the piezoelectric layer 12 is subjected to polarization processing (poling). The polarization processing will be described below in detail.

The transduction film 10 illustrated in FIG. 1A has a configuration in which the thin film electrode 14 is formed on one surface of the piezoelectric layer 12, the protective layer 18 is formed thereon, the thin film electrode 16 is formed on the other surface of the piezoelectric layer 12, and the protective layer 20 is formed thereon.

That is, the transduction film 10 has a configuration in which the piezoelectric layer 12 is interposed between the thin film electrodes 14 and 16, and this laminated body is interposed between the protective layers 18 and 20.

The thin film electrodes 14 and 16 are electrode layers for applying an electric field to the piezoelectric layer 12.

A forming material of the thin film electrodes 14 and 16 is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, and the like are exemplified. Among them, any one of copper, aluminum, gold, silver, platinum, and indium-tin oxide is preferably exemplified.

In addition, a forming method of the thin film electrodes 14 and 16 is not particularly limited, and as the forming method, various known methods such as a vapor-phase deposition method (a vacuum film forming method) such as vacuum vapor deposition or sputtering, film formation using plating, and a method of adhering a foil formed of the materials described above are able to be used.

Among them, in particular, by the reason that the flexibility of the transduction film 10 is able to be ensured, a copper or aluminum thin film formed by using the vacuum vapor deposition is preferably used as the thin film electrodes 14 and 16. Among them, in particular, the copper thin film formed by using the vacuum vapor deposition is preferably used.

Furthermore, the thin film electrodes 14 and 16 may be formed on the piezoelectric layer 12, or as in the illustrated example, when the transduction film 10 includes the protective layers 18 and 20, the thin film electrode may be formed on the protective layer, and then may be laminated into the piezoelectric layer 12.

The thicknesses of the thin film electrodes 14 and 16 are not particularly limited. In addition, the thicknesses of the thin film electrodes 14 and 16 may be basically identical to each other or different from each other.

Here, when the rigidity of the thin film electrodes 14 and 16 excessively increases, not only is stretching and contracting of the piezoelectric layer 12 constrained, but also flexibility is impaired. For this reason, when the thin film electrodes 14 and 16 are in a range where electrical resistance does not excessively increase, it is advantageous as the thickness becomes thinner.

In the transduction film 10, the protective layers 18 and 20 are disposed as a preferred aspect, and have a function of applying suitable rigidity and mechanical strength to a laminated body formed of the piezoelectric layer 12, and the thin film electrodes 14 and 16.

The protective layers 18 and 20 are not particularly limited, and as the protective layers 18 and 20, various sheet-like materials are able to be used. As an example, various resin films (plastic films) are preferably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyether imide (PEI), polyimide (PI), polyethylene naphthalate (PEN), triacetyl cellulose (TAC), and a cyclic olefin-based resin are preferably used.

The thicknesses of the protective layers 18 and 20 are not particularly limited. In addition, the thicknesses of the protective layers 18 and 20 may be basically identical to each other or different from each other.

Here, as with the thin film electrodes 14 and 16 described above, when the rigidity of the protective layers 18 and 20 excessively increases, not only is the stretching and contracting of the piezoelectric layer 12 constrained, but also the flexibility is impaired, and thus it is advantageous as the thickness of the protective layers 18 and 20 becomes thinner unless mechanical strength or excellent handling ability as a sheet-like material is required.

Furthermore, when the protective layers 18 and 20 are extremely thin, and thus the handling ability is degraded, the protective layers 18 and 20 with a peelable separator (a supporter) may be used. As the separator, a PET film having a thickness of approximately 25 μm to 100 μm, and the like are exemplified. The separator also applies to sheet-like materials 34 and 38 exemplified in FIGS. 2A and 2F described below.

According to the consideration of the present inventors, when the thickness of the protective layers 18 and 20 is less than or equal to two times the thickness of the piezoelectric layer 12, it is possible to obtain a preferred result from a viewpoint of compatibility between ensuring of the rigidity and suitable flexibility, or the like.

For example, when the thickness of the piezoelectric layer 12 is 50 μm and the protective layers 18 and 20 are formed of PET, the thickness of the protective layers 18 and 20 is preferably less than or equal to 100 μm, and is more preferably less than or equal to 50 μm, and among them, it is preferable that the thickness of the protective layers 18 and 20 is less than or equal to 25 μm.

In addition, according to the consideration of the present inventors, when the product of the thickness of the thin film electrodes 14 and 16 and the Young's modulus is less than the product of the thickness of the protective layers 18 and 20 and the Young's modulus, the flexibility is not considerably impaired, and thus setting the product of the thickness of the film electrodes 14 and 16 and the Young's modulus to be less than the product of the thickness of the protective layers 18 and 20 and the Young's modulus is preferable.

For example, in a case where the protective layers 18 and 20 are formed of PET (Young's modulus: approximately 6.2 GPa) and the thin film electrodes 14 and 16 are a combination formed of copper (Young's modulus: approximately 130 GPa), when the thickness of the protective layers 18 and 20 is 25 μm, the thickness of the thin film electrodes 14 and 16 is preferably less than or equal to 1.2 μm, and is more preferably less than or equal to 0.3 μm, and among them, it is preferable that the thickness of the thin film electrodes 14 and 16 is less than or equal to 0.1 μm.

As described above, in the transduction film 10 of the present invention, the piezoelectric layer 12 (the polymer composite piezoelectric body) in which the piezoelectric body particles 26 are dispersed in the matrix 24 formed of the polymer material having viscoelasticity at a normal temperature is interposed between the thin film electrodes 14 and 16, and preferably, this laminated body is interposed between the protective layers 18 and 20.

In such a transduction film 10, it is preferable that the maximum value in which the loss tangent (Tan δ) at a frequency of 1 Hz according to the dynamic viscoelasticity measurement is greater than or equal to 0.1 exists at a normal temperature.

Accordingly, even when the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the boundary surface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0 E+05 to 1.0 E+06) N/m at 50° C.

Accordingly, the transduction film 10 is able to have suitable rigidity and mechanical strength within a range not impairing the flexibility and the acoustic properties of the transduction film 10.

Further, in the transduction film 10, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time that the lowest resonance frequency $f_0$ is changed according to the change in the curvature of the speaker.

Here, in the transduction film 10 of the present invention, the area fraction of the piezoelectric body particles 26 in the contact surface with respect to the thin film electrode (the electrode layer) (a contact surface of a layer which is in contact with the thin film electrode with respect to the thin film electrode) is less than or equal to 50%.

That is, in the transduction film 10 of the illustrated example, the area fraction of the piezoelectric body particles 26 in the surface of the piezoelectric layer 12 on the thin film electrode 14 side and the surface of the piezoelectric layer 12 on the thin film electrode 16 side is less than or equal to 50%.

The transduction film 10 of the present invention has such a configuration, and thus in the transduction film 10 including the piezoelectric layer 12 formed of the polymer composite piezoelectric body having excellent flexibility, it is possible to stably exhibit desired properties regardless of a bending state for an operation such as output or a bending state due to usage conditions.

As described above, in order to adopt the electroacoustic transduction film using the polymer composite piezoelectric body as a speaker, it is necessary that the stretching and contracting movement of the piezoelectric body particles 26 (piezoelectric ceramics) is converted into the bending movement of the film surface. For this reason, it is necessary that the electroacoustic transduction film is held in a state of being bent to a certain degree.

However, in the electroacoustic transduction film of the related art, the properties may decrease due to the bending for outputting a sound, or output properties may vary according to the bending due to the usage conditions. Further, in a severe state, the thin film electrode is peeled off from the piezoelectric layer 12 due to repetitive bending, and thus the electroacoustic transduction film of the related art is not able to be driven as an electroacoustic transduction film.

The present inventors has intensively studied about the causes. As a result thereof, it has been found that the thin film electrode is separated from the polymer composite piezoelectric body due to the bending of the electroacoustic transduction film.

Even though it will be described with reference to FIGS. 2A to 2F, in general, the polymer composite piezoelectric body is formed by dissolving the polymer material configuring the matrix 24 in an organic solvent, by preparing a coating in which the piezoelectric body particles 26 are put and dispersed in this solution, and by applying and drying this coating.

Figure 2A:
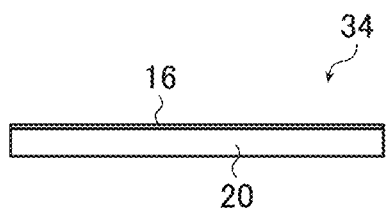
FIGS. 2A to 2F are diagrams conceptually illustrating a manufacturing method of an example of the electroacoustic transduction film of the present invention.
Figure 2B:
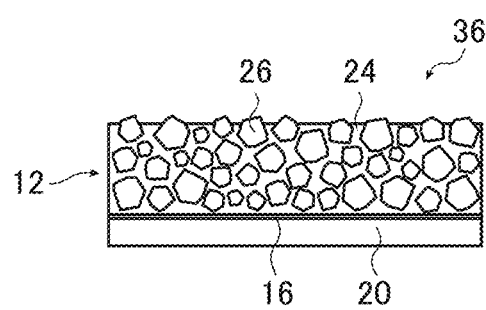

Here, the piezoelectric body particles 26 protrude in many portions of the surface (an upper surface) of the polymer composite piezoelectric body formed in this way (refer to FIG. 2B).

Furthermore, on the lower side of the polymer composite piezoelectric body (the contact surface with respect to a surface to be coated), a coated film becomes flat due to the surface to be coated, and thus such piezoelectric body particles do not protrude. In addition, by the same reason, the lower side of the polymer composite piezoelectric body has high surface smoothness.

On the surface of the polymer composite piezoelectric body, the thin film electrode (the electrode layer) for driving the electroacoustic transduction film is disposed.

However, a protruding portion of the piezoelectric body particles 26 has no adhesive force due to the matrix 24 which also functions as a hinder, and thus the electrode layer and the polymer composite piezoelectric body are physically pressed by a layer formed on the surface of the electrode layer such as the protective layer, and are merely bonded.

Figure 1B:
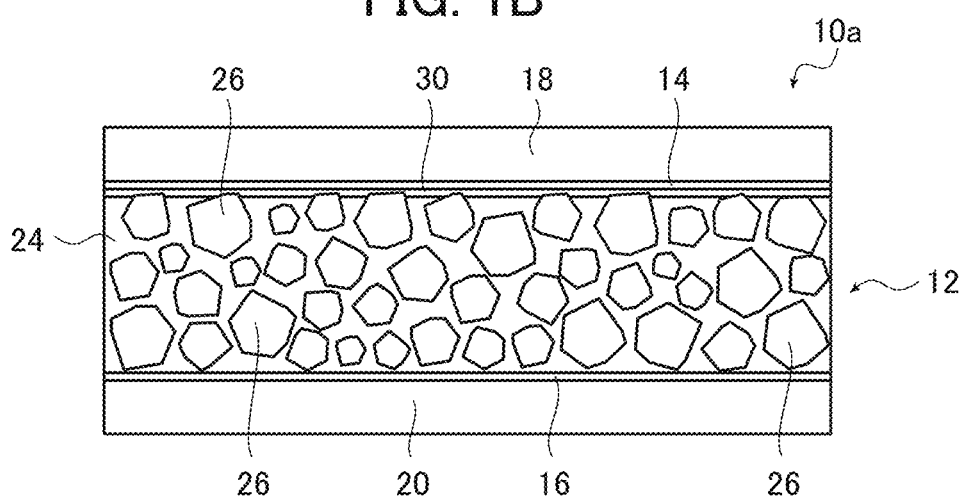
Figure 1C:
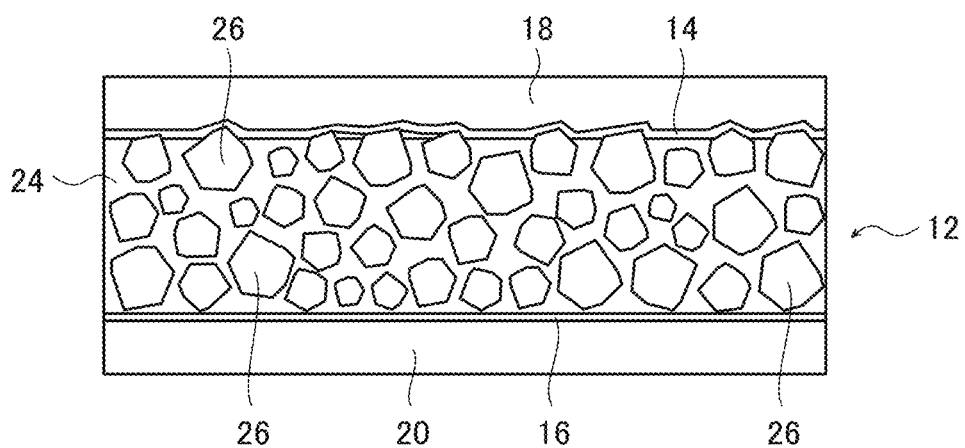
FIG. 1C is a diagram conceptually illustrating an example of an electroacoustic transduction film of the related art.

For this reason, in the protruding portion of the piezoelectric body particles 26, a portion is generated in which the electrode layer is separated (floats) from the polymer composite piezoelectric body (refer to FIG. 1C). In addition, when the electroacoustic transduction film is bent, the separation of the electrode layer from the polymer composite piezoelectric body is widened beginning at the protruding portion of the piezoelectric body particles. When such separation occurs, a desired electric field is applied to the polymer composite piezoelectric body in this portion, and thus a sound pressure level (the output properties) as the acoustic properties of the speaker decreases.

In addition, in a severe state, the electrode layer is peeled off from the polymer composite piezoelectric body due to the separation of the electrode layer from the polymer composite piezoelectric body, and the electroacoustic transduction film is not operated as an electroacoustic transduction film.

In contrast, in the transduction film 10 of the present invention, the area fraction of the piezoelectric body particles 26 in the contact surface with respect to the thin film electrode 14 and the contact surface with respect to the thin film electrode 16 is less than or equal to 50%. In the illustrated example, the area fraction of the piezoelectric body particles 26 in both surfaces of the piezoelectric layer 12 is less than or equal to 50%.

For this reason, a contact area between the matrix 24 (an adhesive layer 30 described below) also functions as an adhesive agent and the thin film electrode increases, and thus it is possible to sufficiently ensure the adhesiveness between the piezoelectric layer 12 and the thin film electrodes 14 and 16. Accordingly, even when the bending state of the transduction film 10 is changed according to the bending of the transduction film 10 for output and according to the usage conditions or the like, it is possible to prevent the piezoelectric layer 12 from being separated (floating) from the thin film electrodes 14 and 16. Further, even when the bending state of the transduction film 10 is changed according to usage conditions or the like, the separation state between the piezoelectric layer 12 and the thin film electrodes 14 and 16 is not changed.

For this reason, according to the transduction film 10 of the present invention, even when the transduction film 10 is bent to function as a speaker, and the transduction film 10 is bent according to the usage conditions or the like, it is possible to stably exhibit predetermined output properties.

In the transduction film 10 of the present invention, the area fraction of the piezoelectric body particles 26 in the contact surface with respect to the thin film electrode 14 and the contact surface with respect to the thin film electrode 16 is preferably less than or equal to 50%, and is more preferably less than or equal to 30%.

Accordingly, the separation of the piezoelectric layer 12 from the thin film electrode is more reliably prevented, and thus it is possible to prevent a decrease in the output properties due to the separation, the transduction film 10 easily corresponds to a flexible speaker or the like which is assumed to be transported by being wound, and when the transduction film 10 is manufactured, the transduction film 10 is easily manufactured by so-called roll-to-roll, and thus a preferred result is obtained from a viewpoint of reducing a variation in the properties.

Furthermore, the area fraction of the piezoelectric body particles 26 in the contact surface with respect to the thin film electrode (the electrode layer), for example, may be obtained by peeling off the thin film electrode, by exposing the contact surface with respect to the thin film electrode (the boundary surface with respect to the surface of the piezoelectric layer 12 or the thin film electrode 14 of the adhesive layer 30 described below), by imaging the contact surface using a scanning type electron microscope, and by calculating a ratio of the area of the piezoelectric body particles 26 to the area of the contact surface with respect to the thin film electrode, for example, on the basis of obtained data using image analysis software.

In addition, in the transduction film 10 of the present invention, it is preferable that the area fraction of the piezoelectric body particles 26 in the contact surface with respect to the thin film electrode is lower than the volume fraction of the piezoelectric body particles 26 in the piezoelectric layer 12 which is calculated from the sectional machining surface of the piezoelectric layer 12 due to FIB.

Such a configuration is preferable from a viewpoint of ensuring the adhesiveness between the piezoelectric layer 12 and the thin film electrode to a certain degree or more even when the volume fraction of the piezoelectric body particles 26 has any value, and of improving manufacturing stability and bending resistance.

Further, in the transduction film 10 of the present invention, it is preferable that the piezoelectric layer 12 has high surface flatness.

Furthermore, the surface of the piezoelectric layer 12 is basically the contact surface (the boundary surface) with respect to the thin film electrode 14 and the thin film electrode 16. Alternatively, when the adhesive layer 30 described below is included between the thin film electrode and the piezoelectric layer 12, the surface of the piezoelectric layer 12 is the contact surface (the boundary surface) with respect to the adhesive layer 30. That is, the surface of the piezoelectric layer 12 is a surface facing the thin film electrode.

Specifically, it is preferable that in the surface of the piezoelectric layer 12, at least one of the arithmetic average roughness Ra of less than or equal to 1 μm, the maximum valley depth Rv of less than or equal to 6 μm, and the maximum height roughness Rz of less than or equal to 12 μm is satisfied. Further, it is more preferable that in the surface of the piezoelectric layer 12, two of the arithmetic average roughness Ra of less than or equal to 1 μm, the maximum valley depth Rv of less than or equal to 6 μm, and the maximum height roughness Rz of less than or equal to 12 μm are satisfied, and it is particularly preferable that in the surface of the piezoelectric layer 12, all of them are satisfied.

In the surface of the piezoelectric layer 12, this flatness is satisfied, and thus partial leak discharge between the electrodes is suppressed, and it is possible to obtain the transduction film 10 having more excellent operation stability. Specifically, by setting the arithmetic average roughness Ra to be less than or equal to 1 μm, it is possible to decrease spots at which the leak discharge occurs. In addition, by setting the maximum valley depth Rv to be less than or equal to 6 μm, it is possible to suppress the leak discharge at a comparatively high applied voltage. Further, by setting the maximum height roughness Rz to be less than or equal to 12 μm, it is possible to decrease the spot at which the leak discharge occurs.

In consideration of the above description, it is preferable that in the surface of the piezoelectric layer 12, at least one of the arithmetic average roughness Ra of less than or equal to 0.7 μm, the maximum valley depth Rv of less than or equal to 5 μm, and the maximum height roughness Rz of less than or equal to 10 μm is satisfied.

Furthermore, it is preferable that all of the arithmetic average roughness Ra, the maximum valley depth Rv, and the maximum height roughness Rz are basically low.

As described above, the flatness of the surface of the piezoelectric layer 12, for example, may be obtained by peeling off the thin film electrode (or the adhesive layer 30), by exposing the surface of the piezoelectric layer 12, and by measuring the arithmetic average roughness Ra, the maximum valley depth Rv, the maximum height roughness Rz, and the like of the surface by a known method using an atomic force microscope (AFM), a confocal optical system laser microscope, a contact type surface roughness meter, and the like.

The arithmetic average roughness Ra or the like of the surface of the piezoelectric layer 12 is also able to be measured by the following method. First, the piezoelectric layer 12 (the transduction film 10) is cut to an arbitrary size, is embedded in an epoxy resin or the like, and is cured. Next, the piezoelectric layer 12 in the resin is cut by using a focused ion beam (FIB) or the like, and thus the sectional surface of the piezoelectric layer 12 is exposed. This sectional surface is observed by using an optical microscope or the like, and thus a boundary line (the boundary surface) having a length of approximately 10 mm between the piezoelectric layer 12 and the thin film electrode 14 is subjected to curve equation conversion using image conversion software, and thus the arithmetic average roughness Ra, the maximum valley depth Rv, the maximum height roughness Rz, and the like are calculated. The calculation of the arithmetic average roughness Ra, and the like due to image analysis of the boundary line in the sectional surface is performed with respect to approximately ten cut surfaces, and the average value is calculated, and thus the arithmetic average roughness Ra, the maximum valley depth Rv, the maximum height roughness Rz, and the like of the surface of the piezoelectric layer 12 are measured.

Furthermore, the arithmetic average roughness Ra, the maximum valley depth Rv, and the maximum height roughness Rz may be basically measured on the basis of JIS B0601 2001.

In the transduction film 10 of the present invention, as a preferred method of setting the area fraction of the piezoelectric body particles 26 in the contact surface with respect to the thin film electrode to be less than or equal to 50%, calender processing is exemplified. In addition, as a method of allowing at least one of the arithmetic average roughness Ra of less than or equal to 1 μm, the maximum valley depth Rv of less than or equal to 6 μm, and the maximum height roughness Rz of less than or equal to 12 μm to be satisfied in the surface of the piezoelectric layer 12, the calender processing is also preferable.

That is, by performing the calender processing, it is possible to attain both of the area fraction of the piezoelectric body particles 26 in the contact surface with respect to the thin film electrode of less than or equal to 50% and the surface flatness of the piezoelectric layer 12.

As it is known, the calender processing is processing of flattening a surface to be processed while heating (performing heating transfer with respect to a flat surface) by using a heating press, a heating roller, or the like. The matrix 24 configuring the piezoelectric layer 12 is heated to a temperature which is higher than or equal to a softening point, and is subjected to the calender processing, and thus the piezoelectric body particles 26 protruding from the piezoelectric layer 12 are pressed into the piezoelectric layer 12, the upper surface of the matrix 24 is relatively moved up according to an increase in the volume of the piezoelectric layer 12 due to the pressed piezoelectric body particles 26, and thus the area fraction of the piezoelectric body particles 26 in the contact surface with respect to the thin film electrode is able to be less than or equal to 50%.

In addition, by performing the calender processing, it is also possible to improve the volume fraction of the piezoelectric body particles 26 in the piezoelectric layer 12.

Furthermore, on the lower side of the piezoelectric layer 12 (the contact surface with respect to the thin film electrode 16), the surface of the piezoelectric layer 12 (the coated film of the coating which forms the piezoelectric layer 12) becomes flat due to the surface of the thin film electrode 16.

As a result thereof, when the area fraction of the piezoelectric body particles 26 in the contact surface with respect to the thin film electrode is less than or equal to 50%, the arithmetic average roughness Ra of less than or equal to 1 μm, the maximum valley depth Rv of less than or equal to 6 μm, and the maximum height roughness Rz of less than or equal to 12 μm of the surface of the piezoelectric layer 12 are concurrently attained. Accordingly, it is not necessary that the lower side of the piezoelectric layer 12 is subjected to flattening processing such as the calender processing.

The conditions such as the temperature and the pressure of the calender processing may be suitably determined according to the material of the matrix 24 of the piezoelectric layer 12 or the like.

Furthermore, it is preferable that this calender processing is performed before the polarization processing of the piezoelectric layer 12.

When the calender processing is performed, a great number of piezoelectric body particles 26 are pressed into the piezoelectric layer 12. At this time, there are particles pressed into the piezoelectric layer 12 with a rotation, and thus when the calender processing is performed after the polarization processing, the piezoelectric body particles 26 are generated in which a polarization direction is inclined from the original film thickness direction, and the piezoelectric properties of the transduction film 10 decrease.

In addition, such a problem also occurs at the time of performing thermal compression bonding described above with respect to the thin film electrode 14 and the protective layer 18 (a sheet-like material 38 described below).

In contrast, the polarization processing is performed after the calender processing, and thus it is possible to prevent a decrease in the piezoelectric properties due to such a rotation of the piezoelectric body particles 26.

In addition, the calender processing is performed once, and thus even when the thin film electrode 14 and the protective layer 18 (the sheet-like material 38) are subjected to the thermal compression bonding described below, the rotation of the piezoelectric body particles 26 does not occur.

As another preferred method of setting the area fraction of the piezoelectric body particles 26 in the contact surface with respect to the thin film electrode to be less than or equal to 50%, a method of disposing the adhesive layer 30 on the surface of the thin film electrode 14 as in a (electroacoustic) transduction film 10*a* illustrated in FIG. 1B is exemplified.

Alternatively, this adhesive layer 30 may be disposed on the surface of the piezoelectric layer 12. Further, the adhesive layer 30 may be disposed on the surface of the thin film electrode 14 and the surface of the piezoelectric layer 12.

According to such an adhesive layer 30, it is possible to embed the piezoelectric body particles 26 protruding from the piezoelectric layer 12 in the adhesive layer 30. Accordingly, the area fraction of the piezoelectric body particles 26 in the contact surface with respect to the thin film electrode 14 (that is, in this example, the upper surface of the adhesive layer 30 (the boundary surface with respect to the thin film electrode 14)) is able to be less than or equal to 50%.

In addition, according to the adhesive layer 30, it is possible to make an adhesive force between the piezoelectric layer 12 and the thin film electrode 14 stronger. For this reason, the transduction film 10*a* including the adhesive layer 30 has extremely high strength with respect to repetitive bending, and even when winding and rewinding at a curvature of approximately 10 mm is repeatedly performed, peeling off or the like does not occur. Accordingly, the transduction film 10*a* including the adhesive layer 30 preferably corresponds to a flexible speaker or the like which is assumed to be transported by being wound.

The thickness of the adhesive layer 30 may be suitably determined according to the area fraction of the piezoelectric body particles 26 in the surface of the piezoelectric layer 12 or the like.

Here, when the thickness of the adhesive layer 30 excessively increases, an electric field strength applied to the piezoelectric body particles 26 decreases, and thus the output properties of the transduction film 10*a* decreases. In consideration of the above description, it is preferable that the thickness of the adhesive layer 30 is less than or equal to 3 µm, and in particular, it is preferable that the thickness of the adhesive layer 30 is less than or equal to 1 µm.

As a forming material of the adhesive layer 30, various materials which are able to allow the piezoelectric layer 12 to adhere to the thin film electrode 14 are able to be used.

Here, in consideration of the properties of the transduction film 10*a* (the piezoelectric layer 12), it is preferable that the same polymer materials as those of the matrix 24 are used as the forming material of the adhesive layer 30.

In a (electroacoustic) transduction film of the present invention, only one of the calender processing and the formation of the adhesive layer 30 may be performed, and it is more preferable that both of the calender processing and the formation of the adhesive layer 30 are performed.

Accordingly, by setting the area fraction of the piezoelectric body particles 26 in the contact surface with respect to the thin film electrode 14 (in this example, the upper surface of the adhesive layer 30) to be lower and the adhesive force between the thin film electrode 14 and the piezoelectric layer 12 to be stronger, and thus it is possible to more reliably prevent the floating between the thin film electrode and the piezoelectric layer 12.

Hereinafter, an example of a manufacturing method of the transduction film 10 will be described with reference to FIGS. 2A to 2F.

First, as illustrated in FIG. 2A, a sheet-like material 34 is prepared in which the thin film electrode 16 is formed on the protective layer 20.

This sheet-like material 34 may be prepared by forming a copper thin film or the like on the surface of the protective layer 20 as the thin film electrode 16 using vacuum vapor deposition, sputtering, plating, and the like. Alternatively, a commercialized product in which the copper thin film or the like is formed on the PET film which is the protective layer 18 may be used as the sheet-like material 34.

On the other hand, a polymer material such as cyanoethylated PVA is dissolved in an organic solvent, and the piezoelectric body particles 26 such as PZT particles are added, stirred, and dispersed, and thus a coating is prepared. The organic solvent is not particularly limited, and as the organic solvent, various organic solvents such as dimethyl formamide (DMF), methyl ethyl ketone, and cyclohexanone are able to be used.

The sheet-like material 34 is prepared, and the coating is prepared, and then the coating is casted (applied) onto the surface of the thin film electrode 16 of the sheet-like material 34, and the organic solvent is evaporated and dried. Accordingly, as illustrated in FIG. 2B, the thin film electrode 16 is formed on the protective layer 20, and the piezoelectric layer 12 is formed on the thin film electrode 16, and thus a laminated body 36 is prepared.

A casting method of this coating is not particularly limited, and as the casting method, all known methods (coating devices) such as a slide coater or a doctor knife (a doctor blade) are able to be used.

Figure 2C:
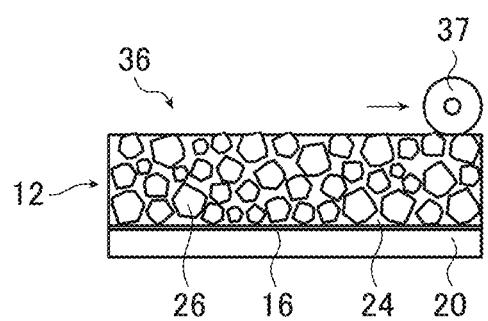

The piezoelectric layer 12 is formed, and then, as illustrated in FIG. 2C, the calender processing is performed by a heating roller 37, and the surface of the piezoelectric layer 12 is flattened while being heated.

Furthermore, as described above, on the lower surface of the piezoelectric layer 12 (the contact surface with respect to the thin film electrode 16), the coated film becomes a flat film by the surface of the thin film electrode 16, and thus such calender processing is not necessary. That is, the area fraction of the piezoelectric body particles 26 in the surface of the piezoelectric layer 12 on the thin film electrode 16 side which is coated with the coating is necessarily less than or equal to 50%, and all of the arithmetic average roughness Ra of less than or equal to 1 µm, the maximum valley depth Rv of less than or equal to 6 µm, and the maximum height roughness Rz of less than or equal to 12 µm are satisfied.

The calender processing is performed, and then the polarization processing (poling) is performed with respect to the piezoelectric layer 12.

Furthermore, as described above, the polarization processing of the piezoelectric layer 12 may be performed before the calender processing, and it is preferable that the polarization processing is performed after the calender processing.

A polarization processing method of the piezoelectric layer 12 is not particularly limited, and as the polarization processing method, a known method is able to be used. As a preferred polarization processing method, a method illustrated in FIGS. 2D and 2E is exemplified.

Figure 2D:
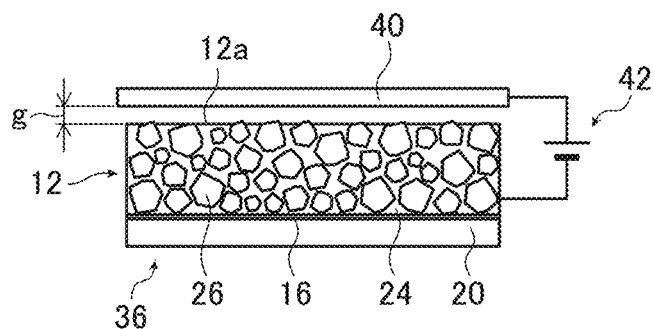
Figure 2E:
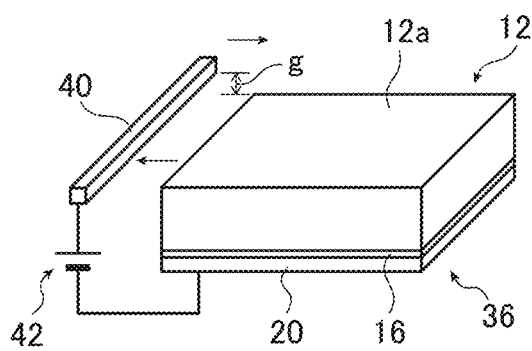

In this method, as illustrated in FIGS. 2D and 2E, for example, a gap g of 1 mm is opened on an upper surface 12*a* of the piezoelectric layer 12 of the laminated body 36, and a rod-like or wire-like corona electrode 40 which is able to be moved along the upper surface 12*a* is disposed. Then, the corona electrode 40 and the thin film electrode 16 are connected to a direct-current power source 42.

Further, heating means for heating and holding the laminated body 36, for example, a hot plate, is prepared.

Then, in a state where the piezoelectric layer 12 is heated and held by the heating means, for example, at a temperature of 100° C., a direct current voltage of a few kV, for example, 6 kV, is applied between the thin film electrode 16 and the corona electrode 40 from the direct-current power source 42, and thus a corona discharge occurs.

Further, in a state where the gap g is maintained, the corona electrode 40 is moved (scanned) along the upper surface 12*a* of the piezoelectric layer 12, and the piezoelectric layer 12 is subjected to the polarization processing. Alternatively, the laminated body 36 may be moved without moving the corona electrode 40, and the polarization processing may be performed.

Furthermore, the polarization processing is not limited to the corona poling processing, and as a target to which the polarization processing is performed, normal electric field poling which directly applies a direct current electric field is also able to be used. However, when this normal electric field poling is performed, it is necessary that the thin film electrode 14 is formed before the polarization processing.

On the other hand, the sheet-like material 38 is prepared in which the thin film electrode 14 is formed on the protective layer 18. This sheet-like material 38 is identical to the sheet-like material 34 described above.

Figure 2F:
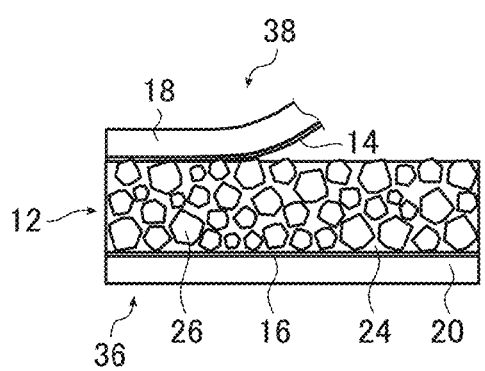

As illustrated in FIG. 2F, in this sheet-like material 38, the thin film electrode 14 is directed towards the piezoelectric layer 12, and is laminated on the laminated body 36 in which the piezoelectric layer 12 is subjected to the polarization processing.

Further, a laminated body of the laminated body 36 and the sheet-like material 38 is interposed between the protective layers 18 and 20, and is subjected to the thermal compression bonding (heat laminating) using a heating press device, a heating roller pair, or the like, and thus the transduction film 10 of the present invention as illustrated in FIG. 1A is completed.

Furthermore, a material in which the adhesive layer 30 is formed on the surface of the thin film electrode 14 is used as the sheet-like material 38, and thus it is possible to prepare the transduction film 10a illustrated in FIG. 1B.

As described above, the electroacoustic transduction film of the present invention is described in detail, but the present invention is not limited to the examples described above, and various improvements or modifications may be performed within a range not deviating from the gist of the present invention.

EXAMPLES

Hereinafter, the electroacoustic transduction film of the present invention will be described in detail with reference to specific examples of the present invention.

Example 1

Cyanoethylated PVA (CR-V manufactured by Shin-Etsu Chemical Co., Ltd.) was dissolved in dimethyl formamide (DMF) at the following compositional ratio. After that, PZT particles were added to this solution as the piezoelectric body particles 26 at the following compositional ratio, and were dispersed by using a propeller mixer (the number of rotations of 2000 rpm), and thus a coating for forming the piezoelectric layer 12 was prepared.

| | |
|---|---|
| PZT Particles | 300 parts by mass |
| Cyanoethylated PVA | 30 parts by mass |
| DMF | 70 parts by mass |

Furthermore, as the PZT particles, PZT particles in which a mixed powder formed by wet mixing a powder of a Pb oxide, a Zr oxide, and a Ti oxide as a main component using a ball mill such that Zr is 0.52 mol and Ti is 0.48 mol with respect to Pb of 1 mol was calcined at 800° C. for 5 hours, and then subjected to crushing processing.

On the other hand, the sheet-like materials 34 and 38 were prepared in which a copper thin film having a thickness of 0.1 μm was vacuum vapor deposited on a PET film having a thickness of 4 μm. That is, in this example, the thin film electrodes 14 and 16 are copper vapor deposition thin films having a thickness of 0.1 m, and the protective layers 18 and 20 are PET films having a thickness of 4 μm.

The coating for forming the piezoelectric layer 12 prepared as described above was applied onto the thin film electrode 16 of the sheet-like material 34 (the copper vapor deposition thin film) by using a slide coater. Furthermore, the coating was applied such that the film thickness of the coated film after being dried was 40 μm.

Next, a material in which the coating is applied onto the sheet-like material 34 was heated and dried on a hot plate at 120° C., and thus DMF was evaporated. Accordingly, the laminated body 36 was prepared in which the copper thin film electrode 16 was formed on the PET protective layer 20, and the piezoelectric layer 12 having a thickness of 40 μm was formed thereon.

The piezoelectric layer 12 of the laminated body 36 was subjected to the polarization processing by corona poling illustrated in FIGS. 2D and 2E as described above. Furthermore, the temperature of the piezoelectric layer 12 was set to 100° C., a direct current voltage of 6 kV was applied between the thin film electrode 16 and the corona electrode 40, and the corona discharge occurred, and thus the polarization processing was performed.

Next, the upper surface of the piezoelectric layer 12 which was subjected to the polarization processing (a surface on a side opposite to the thin film electrode 16) was subjected to the calender processing by using the heating roller 37.

The calender processing was performed by setting the temperature of the heating roller 37 to 70° C., a pressing force to 0.3 MPa, and the movement rate of the heating roller 37 to 0.6 m/min.

The thin film electrode 14 (the copper thin film side) was directed towards the piezoelectric layer 12, and the sheet-like material 38 was laminated on the laminated body 36 which was subjected to the polarization processing.

Next, the laminated body of the laminated body 36 and the sheet-like material 38 were subjected to the thermal compression bonding at 120° C. by using a laminator device, and thus the piezoelectric layer 12 adhered to the thin film electrodes 14 and 16, and the transduction film 10 as illustrated in FIG. 1A was prepared.

A part of this transduction film 10 was cut out, and the protective layer 18 and the thin film electrode 14 were peeled off, and thus the surface of the piezoelectric layer 12 was exposed.

The area fraction of the piezoelectric body particles 26 (the PZT particles) in this surface was calculated by using image analysis software on the basis of image data obtained by imaging the surface of the piezoelectric layer 12 using a scanning type electron microscope (SEM). As a result thereof, the area fraction of the piezoelectric body particles 26 in the surface of the piezoelectric layer 12 (the contact surface with respect to the thin film electrode 14) was 42%.

Further, the arithmetic average surface roughness Ra, the maximum valley depth Rv, and the maximum height roughness Rz of the exposed surface of the piezoelectric layer 12 were measured by surface roughness measurement (cutoff conditions: λs=25 μm) using a confocal optical system laser microscope. As a result thereof, the arithmetic average surface roughness Ra was 0.8 μm, the maximum valley depth Rv was 5.7 μm, and the maximum height roughness Rz was 11.3 μm.

Figure 3A:
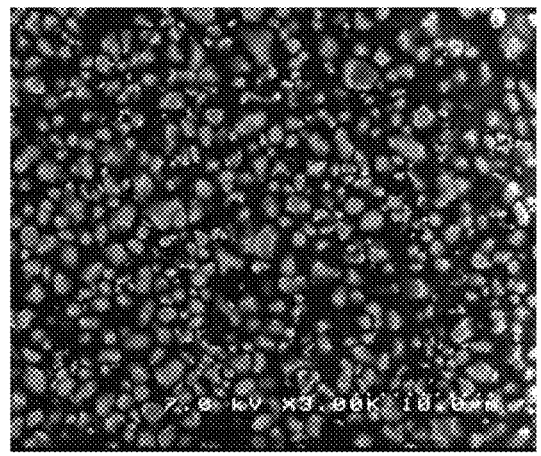
FIGS. 3A and 3B are images which are output by processing a microscope photograph of a contact surface between a piezoelectric layer and a thin film electrode of the electroacoustic transduction film of the present invention.

FIG. 3A illustrates an image output by performing the image processing with respect to an SEM photograph of the surface of the piezoelectric layer 12 from which the protective layer 18 and the thin film electrode 14 are peeled off (3000 times).

Next, this transduction film 10 was subjected to a speaker performance test.

First, a rectangular test piece of 210 mm×100 mm (an A4 size) was cut out from the transduction film 10, was placed on a case 52 of 210 mm×300 mm in which glass wool 50 was contained in advance as conceptually illustrated in FIG. 4, and then the peripheral portion was covered with a cover 54, suitable tension and curvature were applied to the transduction film 10, and thus a thin speaker was assembled. Furthermore, the depth of the case 52 was 9 mm, the density of the glass wool 50 was 32 kg/m³, and a thickness before being assembled was 25 mm.

Then, a sine wave of 1 kHz was input into the thin speaker as an input signal through a power amplifier, a sound pressure level was measured by using a microphone 56 placed at a distance 50 cm separated from the center of the speaker, and the result was 78 dB/W/m.

In concurrence with this speaker performance test, leak discharge at the time of applying a voltage was detected, and thus leak suppressing properties were also evaluated.

Furthermore, the leak discharge at the time of applying a voltage was detected according to the presence or absence of the leak discharge at the time of applying 15 V of an alternating voltage at a frequency of 1 kHz.

As a result thereof, the leak discharge at the time of applying a voltage was not confirmed (leak suppressing properties were A).

Next, the transduction film 10 was subjected to a flexibility test.

The rectangular test piece of 210 mm×300 mm (A4 size) used in the speaker performance test was detached from the thin speaker, was repeatedly wound around and rewound from a rod having a diameter of 10 mm winding 20 times, and then the same thin speaker was assembled again, and the sound pressure level was similarly measured.

As a result thereof, a slight decrease in the sound pressure level was confirmed compared to a case before performing the winding/rewinding (flexibility evaluation was B).

Example 2

The transduction film 10 as illustrated in FIG. 1A was prepared by the same method as that in Example 1 except that the calender processing was performed first, and then the polarization processing was performed by reversing the order of the polarization processing and the calender processing.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 42%, the arithmetic average surface roughness Ra was 0.8 μm, the maximum valley depth Rv was 5.6 μm, and the maximum height roughness Rz was 10.1 μm.

In addition, as with Example 1, the sound pressure level and the leak suppressing properties were measured. As a result thereof, the sound pressure level was 80 dB/W/m, the leak discharge at the time of applying a voltage was not confirmed (the leak suppressing properties were A).

Further, in order to examine the flexibility of the transduction film 10, as with Example 1, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Example 3

The transduction film 10a illustrated in FIG. 1B was prepared by the same method as that in Example 2 except that the sheet-like material 38 in which the adhesive layer 30 was formed on the surface of the thin film electrode 14 was used.

Furthermore, the adhesive layer 30 was formed by using a coating in which 30 parts by weight of cyanoethylated PVA was dissolved in 70 parts by weight of DMF, by applying this coating onto the thin film electrode 14 of the sheet-like material 38, by heating and drying the coating on a hot plate at 120° C., and by evaporating DMF.

The thickness of the adhesive layer 30 was approximately 1 μm.

In this transduction film 10a, as with Example 1, the protective layer 18 and the thin film electrode 14 were peeled off, and the area fraction of the piezoelectric body particles 26 in the surface of the adhesive layer 30 (the contact surface with respect to the thin film electrode 14) was measured. After measuring the area fraction, the adhesive layer 30 was peeled off, and as with Example 1, the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 27%, the arithmetic average surface roughness Ra was 0.7 μm, the maximum valley depth Rv was 5.1 μm, and the maximum height roughness Rz was 8.5 μm.

Figure 3B:
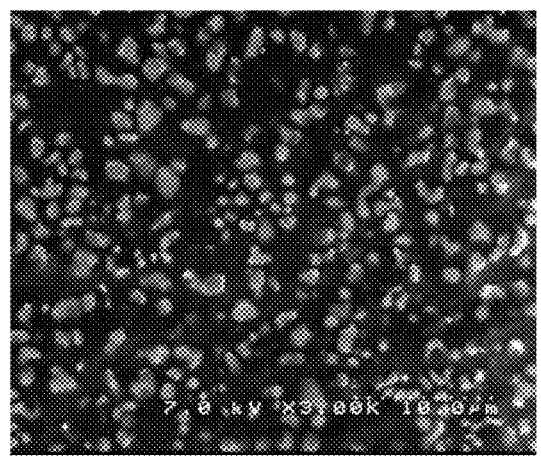

FIG. 3B illustrates an image output by performing the image processing with respect to an SEM photograph of the surface of the adhesive layer 30 from which the protective layer 18 and the thin film electrode 14 are peeled off (3000 times).

In addition, as with Example 1, the sound pressure level and the leak suppressing properties were measured. As a result thereof, the sound pressure level was 80 dB/W/m, the leak discharge at the time of applying a voltage was not confirmed (the leak suppressing properties were A).

Further, in order to examine the flexibility of the transduction film 10a, as with Example 1, the transduction film 10a was subjected to the winding/rewinding after the sound pressure level was measured, and then the sound pressure level was similarly measured.

As a result thereof, the sound pressure level was 80 dB/W/m, and was not changed from a case before performing the winding/rewinding (the flexibility evaluation was A).

Example 4

The transduction film 10 as illustrated in FIG. 1A was prepared by the same method as that in Example 2 except that the thickness of the piezoelectric layer 12 was 30 μm.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 43%, the arithmetic average surface roughness Ra was 0.8 μm, the maximum valley depth Rv was 5.8 μm, and the maximum height roughness Rz was 9.2 μm.

In addition, as with Example 1, the sound pressure level and the leak suppressing properties were measured. As a result thereof, the sound pressure level was 80 dB/W/m, and the leak discharge at the time of applying a voltage was not confirmed (the leak suppressing properties were A).

Further, in order to examine the flexibility of the transduction film 10, as with Example 1, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Example 5

The transduction film 10 as illustrated in FIG. 1A was prepared by the same method as that in Example 2 except that the thickness of the piezoelectric layer 12 was 20 μm.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 43%, the arithmetic average surface roughness Ra was 0.9 μm, the maximum valley depth Rv was 8.6 μm, and the maximum height roughness Rz was 13.1 μm.

In addition, as with Example 1, the sound pressure level and the leak suppressing properties were measured. As a result thereof, the sound pressure level was 80 dB/W/m, and slight leak discharge was confirmed at the time of applying a voltage (the leak suppressing properties were B).

Further, in order to examine the flexibility of the transduction film 10, as with Example 1, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Example 6

The transduction film 10 as illustrated in FIG. 1A was prepared by the same method as that in Example 2 except that the thickness of the piezoelectric layer 12 was 10 μm.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 44%, the arithmetic average surface roughness Ra was 1.1 μm, the maximum valley depth Rv was 9.6 μm, and the maximum height roughness Rz was 15.1 μm.

In addition, as with Example 1, the sound pressure level and the leak suppressing properties were measured. As a result thereof, the sound pressure level was 80 dB/W/m, and slight leak discharge was confirmed at the time of applying a voltage (the leak suppressing properties were B).

Further, in order to examine the flexibility of the transduction film 10, as with Example 1, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Example 7

The transduction film 10 as illustrated in FIG. 1A was prepared by the same method as that in Example 2 except that PZT particles passing through a sieve having a mesh diameter of 20 μm were added, and the thickness of the piezoelectric layer 12 was 20 μm in the preparation of the coating for forming the piezoelectric layer 12.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 41%, the arithmetic average surface roughness Ra was 0.6 μm, the maximum valley depth Rv was 3.3 μm, and the maximum height roughness Rz was 6.4 μm.

In addition, as with Example 1, the sound pressure level and the leak suppressing properties were measured. As a result thereof, the sound pressure level was 80 dB/W/m, and the leak discharge at the time of applying a voltage was not confirmed (the leak suppressing properties were A).

Further, in order to examine the flexibility of the transduction film 10, as with Example 1, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Example 8

The transduction film 10 as illustrated in FIG. 1A was prepared by the same method as that in Example 2 except that PZT particles passing through a sieve having a mesh diameter of 10 μm were added, and the thickness of the piezoelectric layer 12 was 10 μm in the preparation of the coating for forming the piezoelectric layer 12.

In this transduction film 10, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 40%, the arithmetic average surface roughness Ra was 0.6 μm, the maximum valley depth Rv was 3.1 μm, the maximum height roughness Rz was 7.7 μm.

In addition, as with Example 1, the sound pressure level and the leak suppressing properties were measured. As a result thereof, the sound pressure level was 80 dB/W/m, and the leak discharge at the time of applying a voltage was not confirmed (the leak suppressing properties were A).

Further, in order to examine the flexibility of the transduction film 10, the transduction film 10 was subjected to the winding/rewinding after the sound pressure level was measured, and then the sound pressure level was also measured.

As a result thereof, a slight decrease in the sound pressure level was confirmed compared to a case before performing the winding/rewinding (the flexibility evaluation was B).

Comparative Example

A (electroacoustic) transduction film was prepared by the same method as that in Example 1 except that the calender processing was not performed after the polarization processing.

In addition, as with Example 1, the sound pressure level and the leak suppressing properties were measured. As a result thereof, the sound pressure level was 75 dB/W/m, and the leak discharge was continuously confirmed while a voltage was applied (the leak suppressing properties were C).

Further, in order to examine the flexibility of the transduction film 10, as with Example 1, the transduction film was subjected to the winding/rewinding after the sound pressure level was measured, and then the sound pressure level was also measured.

As a result thereof, a considerable decrease in the sound pressure level was confirmed compared to a case before performing the winding/rewinding (the flexibility evaluation was C).

The results are shown in the following table.

TABLE 1

|  | Processing | Piezoelectric Layer Thickness [μm] | Area Fraction [%] | Adhesive Layer | Ra [μm] | Rv [μm] | Rz [μm] | Sound Pressure [dB/W/m] | Leak Suppressing Properties | Flexibility |
| --- | --- | --- | --- | --- | --- | --- | --- | --- | --- | --- |
| Example 1 | Polarization → Calender | 40 | 42 | Absent | 0.8 | 5.7 | 11.3 | 78 | A | B |
| Example 2 | Calender → Polarization | 40 | 42 | Absent | 0.8 | 5.6 | 10.1 | 80 | A | B |
| Example 3 | Calender → Polarization | 40 | 27 | Present | 0.7 | 5.1 | 8.5 | 80 | A | A |
| Example 4 | Calender → Polarization | 30 | 43 | Absent | 0.8 | 5.8 | 9.2 | 80 | A | B |
| Example 5 | Calender → Polarization | 20 | 43 | Absent | 0.9 | 8.6 | 13.1 | 80 | B | B |
| Example 6 | Calender → Polarization | 10 | 44 | Absent | 1.1 | 9.6 | 15.1 | 80 | B | B |
| Example 7 | Calender → Polarization | 20 | 41 | Absent | 0.6 | 3.3 | 6.4 | 80 | A | B |
| Example 8 | Calender → Polarization | 10 | 40 | Absent | 0.6 | 3.1 | 7.7 | 80 | A | B |
| Comparative Example | Polarization Only | 40 | 73 | Absent | 3.2 | 26.5 | 48.3 | 75 | C | C |

The sectional surface of the prepared transduction film was confirmed at a plurality of spots, and as conceptually illustrated in FIG. 1C, the float between the polymer piezoelectric composite body and the thin film electrode 14 was confirmed at the plurality of spots.

In this transduction film 10*a*, as with Example 1, the protective layer 18 and the thin film electrode 14 were peeled off, and the area fraction of the piezoelectric body particles 26 in the surface of the piezoelectric layer 12 (the contact surface with respect to the thin film electrode 14), the arithmetic average surface roughness Ra, the maximum valley depth Rv, and the maximum height roughness Rz of the surface of the piezoelectric layer 12 were measured.

As a result thereof, the area fraction of the piezoelectric body particles 26 was 73%, the arithmetic average surface roughness Ra was 3.2 μm, the maximum valley depth Rv was 26.5 μm, and the maximum height roughness Rz was 48.3 μm.

Figure 3C:
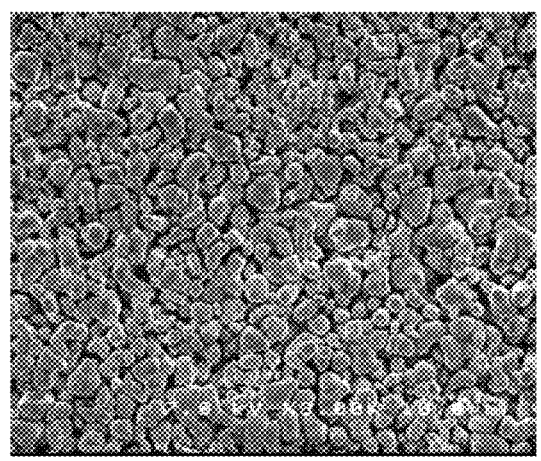
FIG. 3C is an image which is output by processing a microscope photograph of a contact surface between a piezoelectric layer and a thin film electrode of the electroacoustic transduction film of the related art.

FIG. 3C illustrates an image output by performing the image processing with respect to an SEM photograph of the surface of the piezoelectric layer 12 from which the protective layer 18 and the thin film electrode 14 are peeled off (3000 times).

It is considered that more excellent properties are obtained by performing the calender processing before the polarization processing in Examples 2 to 8. In addition, in Example 3, the adhesive force between the piezoelectric layer 12 and the thin film electrode 14 becomes strong due to the adhesive layer 30, and thus even when the winding and rewinding is repeated, an excellent sound pressure level is maintained. Further, the flatness of the piezoelectric layer 12 is excellent in Examples 1 to 8, and in particular, the leak suppressing properties at the time of applying a voltage are also excellent in Examples 1 to 4, and Examples 7 and 8.

In contrast, in Comparative Example, it is considered that the area fraction of the piezoelectric body particles 26 is high, and thus the floating occurs on the boundary surface between the thin film electrode 14 and the piezoelectric layer 12, and the sound pressure level decreases. In addition, in Comparative Example, it is considered that the area fraction of the piezoelectric body particles 26 is high, and thus the adhesive force between the thin film electrode 14 and the piezoelectric layer 12 also decreases, and the sound pressure level considerably decreases after the winding and rewinding is repeated. Further, in Comparative Example, the flatness of the piezoelectric layer 12 decreases and the leak continuously occurs at the time of applying a voltage.

From the results described above, the effects of the present invention are obvious.

What is claimed is:

1. An electroacoustic transduction film, comprising:
a polymer composite piezoelectric body in which piezoelectric body particles are dispersed in a viscoelastic matrix formed of a polymer material having viscoelasticity at a normal temperature; and
electrode layers disposed to interpose the polymer composite piezoelectric body therebetween,
wherein an area fraction of the piezoelectric body particles in a contact surface with respect to the electrode layer, which is calculated from data obtained by peeling off the electrode layer, by exposing the contact surface with respect to the electrode layer, and by imaging the contact surface with respect to the electrode layer, is less than or equal to 50%, and
wherein in a surface of the polymer composite piezoelectric body facing the electrode layer, at least one of an arithmetic average roughness Ra of less than or equal to 1 μm, a maximum valley depth Rv of less than or equal to 6 μm, and a maximum height roughness Rz of less than or equal to 12 μm is satisfied.

2. The electroacoustic transduction film according to claim 1,
wherein an adhesive layer is included between the polymer composite piezoelectric body and at least one electrode layer.

3. The electroacoustic transduction film according to claim 1,
wherein the polymer composite piezoelectric body is subjected to calender processing.

4. The electroacoustic transduction film according to claim 3,
wherein the polymer composite piezoelectric body is subjected to polarization processing after the calender processing.

5. The electroacoustic transduction film according to claim 1,
wherein the area fraction of the piezoelectric body particles in the contact surface with respect to the electrode layer is lower than a volume fraction of the piezoelectric body particles which is calculated from a sectional machining surface of the polymer composite piezoelectric body by using a focused ion beam.

6. The electroacoustic transduction film according to claim 1,
wherein a volume fraction of the piezoelectric body particles which is calculated from a sectional machining surface of the polymer composite piezoelectric body by using a focused ion beam is greater than or equal to 50%.

7. The electroacoustic transduction film according to claim 1,
wherein a protective layer is included on a surface of at least one of the electrode layers.

8. The electroacoustic transduction film according to claim 2,
wherein a thickness of the adhesive layer is less than or equal to 3 μm.

9. The electroacoustic transduction film according to claim 2,
wherein the adhesive layer is formed of a same material as the polymer material.

10. An electroacoustic transduction film, comprising:
a polymer composite piezoelectric body in which piezoelectric body particles are dispersed in a viscoelastic matrix formed of a polymer material having viscoelasticity at a normal temperature; and
electrode layers disposed to interpose the polymer composite piezoelectric body therebetween,
wherein an area fraction of the piezoelectric body particles in a contact surface with respect to the electrode layer, which is calculated from data obtained by peeling off the electrode layer, by exposing the contact surface with respect to the electrode layer, and by imaging the contact surface with respect to the electrode layer, is less than or equal to 50%, and
wherein the area fraction of the piezoelectric body particles in the contact surface with respect to the electrode layer is lower than a volume fraction of the piezoelectric body particles which is calculated from a sectional machining surface of the polymer composite piezoelectric body by using a focused ion beam.

11. The electroacoustic transduction film according to claim 10,
wherein an adhesive layer is included between the polymer composite piezoelectric body and at least one electrode layer.

12. The electroacoustic transduction film according to claim 10,
wherein the polymer composite piezoelectric body is subjected to calender processing.

13. The electroacoustic transduction film according to claim 12,
wherein the polymer composite piezoelectric body is subjected to polarization processing after the calender processing.

14. The electroacoustic transduction film according to claim 10,
wherein the volume fraction of the piezoelectric body particles which is calculated from the sectional machining surface of the polymer composite piezoelectric body by using the focused ion beam is greater than or equal to 50%.

15. The electroacoustic transduction film according to claim 10,
wherein a protective layer is included on a surface of at least one of the electrode layers.

16. An electroacoustic transduction film, comprising:
a polymer composite piezoelectric body in which piezoelectric body particles are dispersed in a viscoelastic matrix formed of a polymer material having viscoelasticity at a normal temperature; and
electrode layers disposed to interpose the polymer composite piezoelectric body therebetween,
wherein an area fraction of the piezoelectric body particles in a contact surface with respect to the electrode layer, which is calculated from data obtained by peeling off the electrode layer, by exposing the contact surface with respect to the electrode layer, and by imaging the contact surface with respect to the electrode layer, is less than or equal to 50%, and
wherein a volume fraction of the piezoelectric body particles which is calculated from a sectional machining surface of the polymer composite piezoelectric body by using a focused ion beam is greater than or equal to 50%.

17. The electroacoustic transduction film according to claim 16,
wherein an adhesive layer is included between the polymer composite piezoelectric body and at least one electrode layer.

18. The electroacoustic transduction film according to claim 16,
   wherein the polymer composite piezoelectric body is subjected to calender processing.

19. The electroacoustic transduction film according to claim 18,
   wherein the polymer composite piezoelectric body is subjected to polarization processing after the calender processing.

20. The electroacoustic transduction film according to claim 16,
   wherein a protective layer is included on a surface of at least one of the electrode layers.

\* \* \* \* \*